United States Patent
Lee et al.

(10) Patent No.: US 8,618,543 B2
(45) Date of Patent: Dec. 31, 2013

(54) THIN FILM TRANSISTOR INCLUDING SELECTIVELY CRYSTALLIZED CHANNEL LAYER AND METHOD OF MANUFACTURING THE THIN FILM TRANSISTOR

(75) Inventors: Eun-ha Lee, Seoul (KR); Dong-hun Kang, Yongin-si (KR); Jae-cheol Lee, Suwon-si (KR); Chang-jung Kim, Yongin-si (KR); Hyuck Lim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 414 days.

(21) Appl. No.: 11/978,581

(22) Filed: Oct. 30, 2007

(65) Prior Publication Data

US 2008/0258140 A1   Oct. 23, 2008

(30) Foreign Application Priority Data

Apr. 20, 2007   (KR) .................. 10-2007-0038978

(51) Int. Cl.
*H01L 29/04* (2006.01)

(52) U.S. Cl.
USPC ............. 257/52; 257/43; 257/57; 257/64; 257/66; 257/E29.049; 257/E29.056; 438/104

(58) Field of Classification Search
USPC .............. 257/43, E29.003, 52, 57, 64, 66, 257/E29.049, E29.056; 438/104, 149, 151
See application file for complete search history.

(56) References Cited

U.S. PATENT DOCUMENTS

| | | | |
|---|---|---|---|
| 4,960,718 | A | 10/1990 | Aina |
| 5,337,274 | A | 8/1994 | Ohji |
| 5,656,824 | A | 8/1997 | Den Boer et al. |
| 5,854,139 | A | 12/1998 | Aratani et al. |
| 5,972,527 | A | 10/1999 | Kaijou et al. |
| 6,107,734 | A | 8/2000 | Tanaka et al. |

(Continued)

FOREIGN PATENT DOCUMENTS

| | | |
|---|---|---|
| CN | 1348192 | 5/2002 |
| EP | 1 737 044 | 12/2006 |

(Continued)

OTHER PUBLICATIONS

Office Action mailed May 11, 2010 for co-pending U.S. Appl. No. 11/978,581.

(Continued)

*Primary Examiner* — Kenneth Parker
*Assistant Examiner* — John Lin
(74) *Attorney, Agent, or Firm* — Harness, Dickey & Pierce, P.L.C.

(57) ABSTRACT

Provided are a thin film transistor (TFT) including a selectively crystallized channel layer, and a method of manufacturing the TFT. The TFT includes a gate, the channel layer, a source, and a drain. The channel layer is formed of an oxide semiconductor, and at least a portion of the channel layer contacting the source and the drain is crystallized. In the method of manufacturing the TFT, the channel layer is formed of an oxide semiconductor, and a metal component is injected into the channel layer so as to crystallize at least a portion of the channel layer contacting the source and the drain. The metal component can be injected into the channel layer by depositing and heat-treating a metal layer or by ion-implantation.

19 Claims, 13 Drawing Sheets

(56) References Cited

U.S. PATENT DOCUMENTS

| | | |
|---|---|---|
| 6,458,636 B1 | 10/2002 | Yi et al. |
| 6,552,387 B1 | 4/2003 | Eitan |
| 6,562,491 B1 | 5/2003 | Jeon |
| 6,563,174 B2 | 5/2003 | Kawasaki et al. |
| 6,727,522 B1 | 4/2004 | Kawasaki et al. |
| 6,727,533 B2 | 4/2004 | Matsuzaki et al. |
| 6,878,962 B1 | 4/2005 | Kawasaki et al. |
| 6,882,012 B2 | 4/2005 | Yamazaki et al. |
| 6,929,970 B2 | 8/2005 | Andriessen et al. |
| 7,061,014 B2 | 6/2006 | Hosono et al. |
| 7,067,843 B2 | 6/2006 | Carcia et al. |
| 7,071,122 B2 | 7/2006 | Saenger et al. |
| 7,145,174 B2 | 12/2006 | Chiang et al. |
| 7,188,922 B2 | 3/2007 | Kubo |
| 7,189,992 B2 | 3/2007 | Wager, III et al. |
| 7,220,635 B2 | 5/2007 | Brask et al. |
| 7,285,501 B2 | 10/2007 | Mardilovich et al. |
| 7,411,209 B2 | 8/2008 | Endo et al. |
| 7,456,468 B2 | 11/2008 | Jeon et al. |
| 8,299,461 B2 | 10/2012 | Tanaka et al. |
| 2001/0000756 A1 | 5/2001 | Batra et al. |
| 2002/0074657 A1 | 6/2002 | Nakayama et al. |
| 2002/0146624 A1 | 10/2002 | Goto et al. |
| 2003/0218221 A1 | 11/2003 | Wager, III et al. |
| 2004/0038446 A1 | 2/2004 | Takeda et al. |
| 2004/0069990 A1 | 4/2004 | Mahajani et al. |
| 2004/0127038 A1 | 7/2004 | Carcia et al. |
| 2004/0155270 A1 | 8/2004 | Hoffman |
| 2004/0180217 A1 | 9/2004 | Inoue et al. |
| 2005/0017244 A1 | 1/2005 | Hoffman et al. |
| 2005/0017302 A1 | 1/2005 | Hoffman |
| 2005/0039670 A1 | 2/2005 | Hosono et al. |
| 2005/0062134 A1 | 3/2005 | Ho et al. |
| 2005/0167668 A1 | 8/2005 | Korenari et al. |
| 2005/0199959 A1* | 9/2005 | Chiang et al. ............... 257/368 |
| 2005/0199960 A1 | 9/2005 | Hoffman et al. |
| 2005/0258474 A1 | 11/2005 | Tanaka et al. |
| 2005/0275038 A1 | 12/2005 | Shih et al. |
| 2006/0003485 A1 | 1/2006 | Hoffman et al. |
| 2006/0038242 A1 | 2/2006 | Hsu et al. |
| 2006/0068091 A1 | 3/2006 | Denda |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1* | 5/2006 | Sano et al. ............... 257/347 |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0214008 A1 | 9/2006 | Asami et al. |
| 2006/0220023 A1 | 10/2006 | Hoffman et al. |
| 2006/0244107 A1 | 11/2006 | Sugihara et al. |
| 2006/0284172 A1 | 12/2006 | Ishii |
| 2006/0286737 A1 | 12/2006 | Levy et al. |
| 2006/0292777 A1 | 12/2006 | Dunbar |
| 2007/0007538 A1 | 1/2007 | Ono et al. |
| 2007/0023750 A1 | 2/2007 | Chiang et al. |
| 2007/0072439 A1 | 3/2007 | Akimoto et al. |
| 2007/0184576 A1 | 8/2007 | Chang et al. |
| 2007/0187760 A1 | 8/2007 | Furuta et al. |
| 2007/0194379 A1 | 8/2007 | Hosono et al. |
| 2007/0254399 A1* | 11/2007 | Wang et al. ............... 438/62 |
| 2008/0067508 A1 | 3/2008 | Endo et al. |
| 2008/0197414 A1 | 8/2008 | Hoffman et al. |
| 2008/0206923 A1 | 8/2008 | Kim et al. |
| 2008/0315194 A1 | 12/2008 | Kim et al. |
| 2008/0315200 A1 | 12/2008 | Kim et al. |
| 2010/0127253 A1 | 5/2010 | Inoue et al. |

FOREIGN PATENT DOCUMENTS

| | | |
|---|---|---|
| JP | 63-265818 | 11/1988 |
| JP | 10-306367 | 11/1998 |
| JP | 2003-017749 | 1/2003 |
| JP | 2003-298062 | 10/2003 |
| JP | 2004-356196 | 12/2004 |
| JP | 2005-026465 | 1/2005 |
| JP | 2005-033172 | 2/2005 |
| JP | 2005-093974 | 4/2005 |
| JP | 2005-322898 | 11/2005 |
| JP | 2006-005116 | 1/2006 |
| JP | 2006-040934 | 2/2006 |
| JP | 2006-054423 | 2/2006 |
| JP | 2007-059128 | 3/2007 |
| JP | 2007-073312 | 3/2007 |
| JP | 2007-529119 | 10/2007 |
| KR | 10-2000-0074893 | 12/2000 |
| KR | 10-2005-0092712 | 9/2005 |
| KR | 10-2006-0077178 | 7/2006 |
| KR | 10-2006-0078501 | 7/2006 |
| KR | 10-2006-0114469 | 11/2006 |
| KR | 10-0701555 | 3/2007 |
| KR | 10-2007-0090182 | 9/2007 |
| KR | 10-0811997 | 3/2008 |
| WO | WO 2005/074038 A1 | 8/2005 |
| WO | WO 2005/088726 | 9/2005 |
| WO | WO 2007/040194 | 4/2007 |
| WO | WO 2007/119386 | 10/2007 |

OTHER PUBLICATIONS

Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Aug. 20, 2009 for co-pending U.S. Appl. No. 11/785,269.
Office Action mailed Apr. 2, 2010 for co-pending U.S. Appl. No. 12/213,327.
Office Action mailed Sep. 15, 2009 for co-pending U.S. Appl. No. 12/213,327.
Office Action mailed Nov. 16, 2009 for co-pending U.S. Appl. No. 12/213,399.
Office Action mailed May 21, 2010 for co-pending U.S. Appl. No. 11/785,269.
International Search Report dated May 21, 2008.
International Search Report dated Dec. 19, 2008.
International Search Report dated Sep. 25, 2008.
European Search Report dated Aug. 28, 2009.
European Search Report and Written Opinion dated Jun. 16, 2010.
European Search Report and Written Opinion dated Jun. 14, 2010.
Chinese Office Action mailed Aug. 4, 2010 and English translation thereof.
Chinese Office Action mailed Aug. 23, 2010 and English translation thereof.
Office Action issued by the European Patent Office dated May 10, 2011 for EP Application No. 09 160 223.5-1528.
U.S. Office Action dated Jul. 25, 2011, issued in co-pending U.S. Appl. No. 12/213,402.
U.S. Office Action dated Jul. 7, 2011, issued in co-pending U.S. Appl. No. 12/453,530.
The MOSFET—Introduction, MOS Field Effect Transistors, B.J. Van Zeghbroeck, Web book "Principles of Semiconductor Devices", Boulder, Dec. 2004, Chapter 7.
U.S. Office Action dated Jun. 27, 2011, issued in co-pending U.S. Appl. No. 12/071,097.
Notice of Allowance dated Oct. 14, 2010, for Co-Pending U.S. Appl. No. 11/785,269.
U.S. Office Action dated Dec. 3, 2010, for Co-Pending U.S. Appl. No. 12/071,097.
Supplemental Notice of Allowance dated Dec. 27, 2010 for Co-Pending U.S. Appl. No. 11/785,269.
U.S. Office Action dated Jan. 13, 2011 for Co-Pending U.S. Appl. No. 12/453,530.
US Office Action dated Feb. 25, 2011, for Co-Pending U.S. Appl. No. 12/213,402.

(56) References Cited

OTHER PUBLICATIONS

Office Action for Chinese Application No. 200780022377.5 dated Oct. 25, 2010 and English Translation thereof.

Notice of Allowance dated Dec. 8, 2011, issued in co-pending U.S. Appl. No. 12/213,402.

U.S. Office Action dated Nov. 23, 2011, issued in co-pending U.S. Appl. No. 12/071,097.

Normura, Kenji et al. "Room-temperature fabrication of transparent flexible thin-film transistors using amorphous oxide semiconductors," *Nature*, vol. 432 (Nov. 25, 2004): pp. 488-492.

US Office Action dated Jul. 17, 2012 issued in U.S. Appl. No. 12/929,324.

Japanese Office Action dated Jan. 1, 2012 issued in Japanese Application No. 2009-506414.

Carcia, P.F. et al. "Transparent ZnO thin-film transistor fabricated by rf magnetron sputtering," *Applied Physics Letters*, vol. 82, No. 7 (Feb. 17, 2003): pp. 1117-1119.

International Search Report and Written Opinion dated Jul. 25, 2007 issued in International Application No. PCT/KR2007/001875.

European Search Report dated Jan. 23, 2012 issued in European Application No. 11183826.4.

European Exam Report dated Jan. 23, 2012 issued in European Application No. 09160223.5.

U.S. Office Action dated Mar. 22, 2012 issued in U.S. Appl. No. 12/929,324.

U.S. Notice of Allowance dated Apr. 5, 2012 issued in U.S. Appl. No. 12/213,402.

U.S. Office Action dated Apr. 13, 2012 issued in U.S. Appl. No. 12/929,323.

Notice of Allowance dated Dec. 7, 2012 issued in U.S. Appl. No. 12/929,324.

Japanese Office Action issued in Japanese Patent Application No. 2010-513115 dated Nov. 20, 2012 and English translation thereof.

Chinese Office Action dated Aug. 23, 2012, issued in Application No. 200910140975.3 and English translation thereof.

Korean Office Action issued in Korean Patent Application No. 10-2007-0051080 dated May 24, 2013 and English translation thereof.

U.S. Office Action issued in U.S. Appl. No. 12/929,323, dated Jul. 5, 2013.

Korea Office Action issued in Korean Patent Application No. 10-2007-0038978 dated Apr. 25, 2013 and English translation thereof.

* cited by examiner

THIN FILM TRANSISTOR INCLUDING SELECTIVELY CRYSTALLIZED CHANNEL LAYER AND METHOD OF MANUFACTURING THE THIN FILM TRANSISTOR

CROSS-REFERENCE TO RELATED PATENT APPLICATION

This application claims the benefit of Korean Patent Application No. 10-2007-0038978, filed on Apr. 20, 2007, in the Korean Intellectual Property Office, the disclosure of which is incorporated herein in its entirety by reference.

BACKGROUND OF THE INVENTION

1. Field of the Invention

The present invention relates to a semiconductor device, and more particularly, to a thin film transistor (TFT) including a selectively crystallized channel layer and a method of manufacturing the TFT.

2. Description of the Related Art

TFTs are used for static random access memories (SRAMs) and read only memories (ROMs). Particularly, TFTs are widely used as pixel driving devices in active matrix flat panel displays. For example, TFTs are used as switching devices or current driving devices in liquid crystal displays or organic electro-luminescence displays.

When TFTs are used as switching devices, the TFTs protect pixels from electric interferences with neighboring pixels and transmit electric signals to the pixels.

TFTs are formed of a semiconductor such as amorphous silicon (Si) and poly-Si. Poly-Si may be a suitable semiconductor for forming TFTs in terms of the current driving ability and charge carrier mobility of the TFTs. However, amorphous Si may be more suitable for forming TFTs when process temperature and available substrates are considered. Therefore, most of the current TFTs are formed using amorphous Si.

However, when amorphous Si is used for forming channel layers of TFTs, the charge carrier mobility of the channel layers is low (0.5 $cm^2/Vs$). Therefore, it is difficult to increase the operating speed of a liquid crystal display when TFTs having amorphous-Si channel layers are used as switching devices in a liquid crystal display.

For this reason, ZnO based materials such as Ga—In—Zn—O having a higher charge carrier mobility than amorphous Si have been studied as materials for channel layers of TFTs

SUMMARY OF THE INVENTION

The present invention provides a reliable thin film transistor (TFT) having stable contact characteristics for high charge carrier mobility and low off-current operation.

The present invention also provides a method of manufacturing the TFT.

According to an aspect of the present invention, there is provided a TFT including a gate, a channel layer, a source, and a drain, wherein the channel layer is formed of an oxide semiconductor, and at least a portion of the channel layer contacting the source and the drain is a crystallized portion.

A portion of the channel layer located between the source and the drain may be also crystallized. In addition, the entire channel layer can be crystallized.

The TFT may further include a metal layer formed on the channel layer under the source and the drain.

The source and the drain may be formed of at least one selected from the group consisting of Ti, Mo, Cr, W, Zr, Hf, Nb, Ta, Ag, Au, Al, Cu, Co, Sb, V, Ru, Pt, Pd, Zn, and Mg.

The oxide semiconductor may be $a(In2O3).b(Ga2O3).c(ZnO)$ doped with titanium (Ti) or lanthanum (La), where a, b, and c are real numbers, and $a \geq 0$, $b \geq 0$, and $c > 0$.

According to another aspect of the present invention, there is provided a method of manufacturing a TFT including a gate, a channel layer, a source, and a drain, the method including: forming the channel layer using an oxide semiconductor; and crystallizing at least a portion of the channel layer contacting the source and the drain by injecting a metal component into the channel layer.

The injecting of the metal component may comprise: forming a metal layer on the channel layer; and heat-treating a resulting structure including the metal layer.

The metal layer may be formed to a predetermined thickness such that the metal layer disappears after the heat-treating.

The metal layer may be formed on the channel layer under the source and the drain.

The forming of the metal layer may comprise: forming the source and the drain on the channel layer; and forming the metal layer on the source, the drain, and a top surface portion of the channel layer located between the source and the drain.

The metal layer may be formed on side surfaces and a top surface of the channel layer.

The heat-treating may be performed after forming the source and the drain on the metal layer.

The heat-treating may be performed in an nitrogen gas atmosphere in a temperature range of 200° C. to 450° C. using a furnace, a rapid thermal annealing (RTA) apparatus, or a laser.

The injecting of the metal component may comprise: ion-injecting the metal component into the channel layer; and heat-treating the channel layer.

The metal component may be ion-injected into the entire channel layer or a portion of the channel layer.

The metal component may be ion-injected into the entire channel layer before the source and drain are formed.

The ion-injecting of the metal component may be performed after forming the source and the drain.

The metal component may be titanium (Ti) or lanthanum (La).

The crystallizing may comprise crystallizing a portion of the channel layer located between the source and the drain, or crystallizing entire channel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
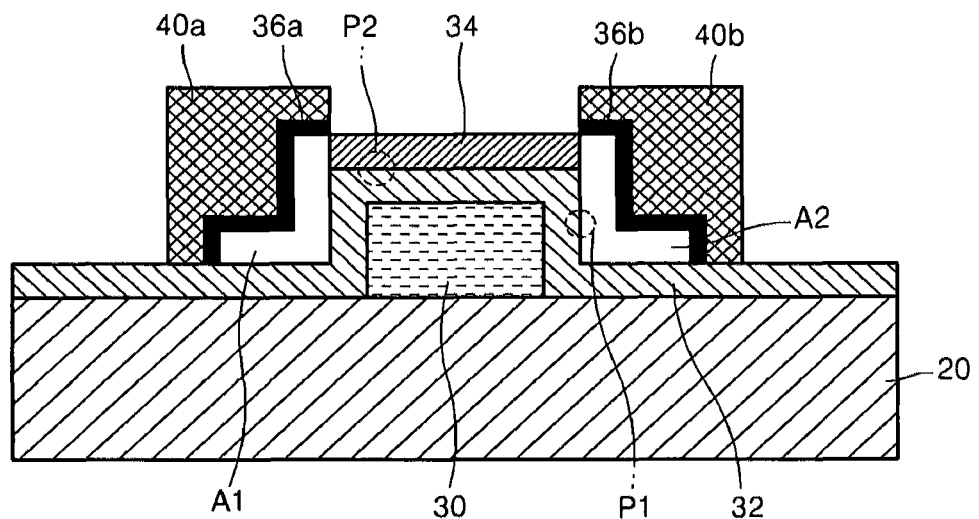
FIG. 1 is a cross-sectional view illustrating a thin film transistor (TFT) including a selectively crystallized channel layer according to an embodiment of the present invention.

A thin film transistor (TFT) including a selectively crystallized channel layer and a method of manufacturing the TFT will now be described more fully with reference to the accompanying drawings, in which exemplary embodiments of the invention are shown. In the drawings, the thicknesses of layers and regions are exaggerated for clarity.

A TFT including a selectively crystallized channel layer will now be described according to an embodiment of the present invention.

Referring to FIG. 1, a gate 30 is formed on a substrate 20. The substrate 20 may be an insulation substrate. Alternatively, the substrate 20 may be configured with a semiconductor substrate and an insulation layer formed on the semiconductor substrate. The gate 30 may be formed of a conductive material such as molybdenum (Mo). A gate insulation layer 32 is formed on the substrate 20 including the gate 30. The gate insulation layer 32 may be formed of a silicon oxide such as $SiO_2$. Alternatively, the gate insulation layer 32 can be formed of other insulation materials. A channel layer 34 is formed on the gate insulation layer 32. The channel layer 34 is formed on the gate insulation layer 32 above the gate 30. The channel layer 34 may be an amorphous oxide semiconductor layer. For example, the channel layer 34 may be formed of a(In2O3).b(Ga2O3).c(ZnO) (where a, b, and c are real numbers, and a≥0, b≥0, and c>0).

A source electrode 40a is formed on the gate insulation layer 32 and one side of the channel layer 34. A drain electrode 40b is formed on the gate insulation layer 32 and the other side of the channel layer 34. Both sides of the channel layer 34 on which the source electrode 40a and the drain electrode 40b are respectively formed are denoted as first and second portions A1 and A2. The first and second portions A1 and A2 are distant from each other. Boundary regions of the first and second portions A1 and A2 that are in contact with the source and drains electrodes 40a and 40b are crystallized. Alternatively, all the first and second portions A1 and A2 can be crystallized. A middle portion of the channel layer 34 between the first and second portions A1 and A2 may remain amorphous.

Figure 7:
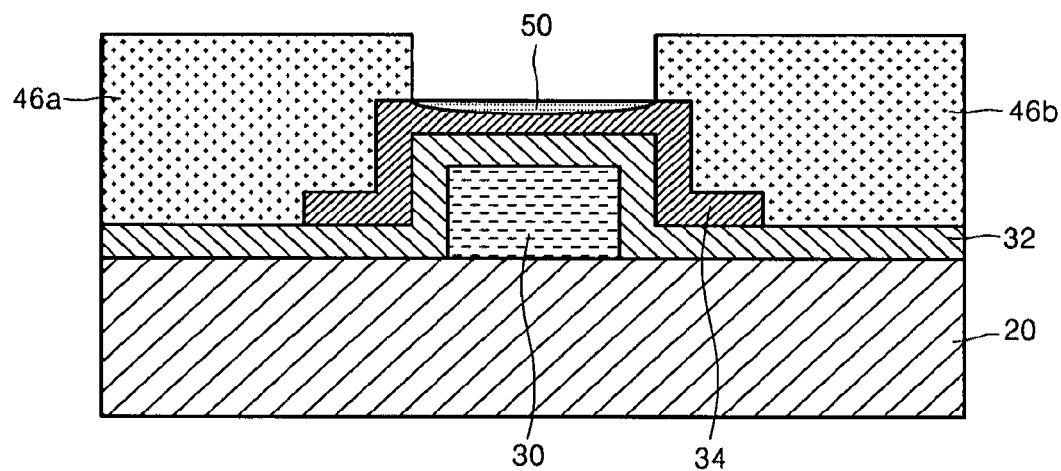
Figure 10:
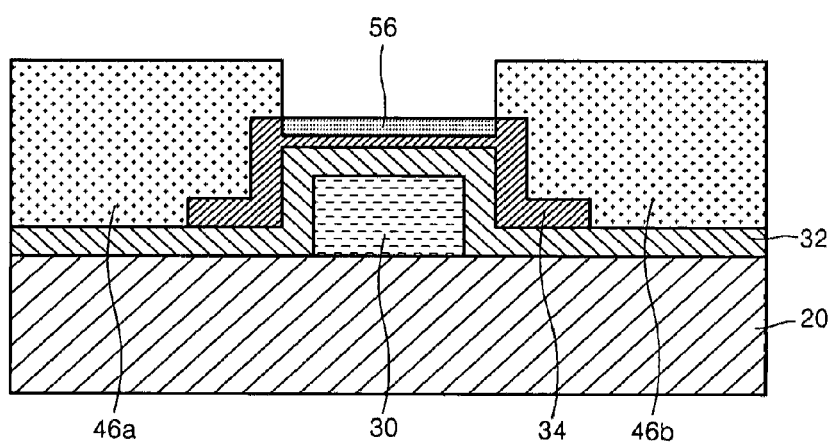

Alternatively, the middle portion of the channel layer 34 can be crystallized (i.e., the entire channel layer 34 can be crystallized), or a region of the middle portion of the channel layer 34 located between the source and drain electrodes 46a and 46b can be crystallized as shown in FIGS. 7 and 10. For example, an upper portion 50 or 56 of the channel layer 34 can be crystallized. Referring to FIGS. 7 and 10, the upper portion 50 or 56 can be formed to a predetermined depth from a top surface of the channel layer 34.

Figure 8:
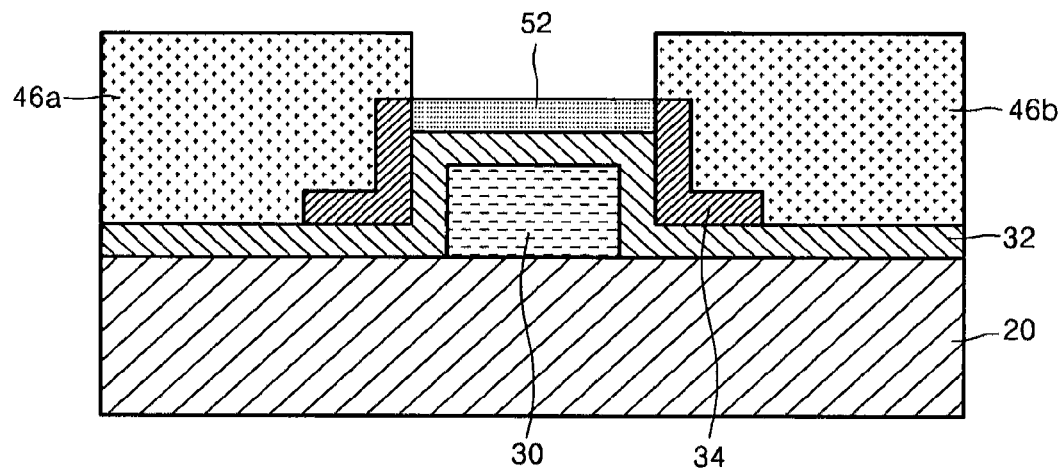

Alternatively, the first and second portions A1 and A2 of the channel layer 34 can be amorphous, and the other portion of the channel layer 34 can be crystallized. For example, only the upper portion 50 or 56 of the channel layer 34 between the first and second portions A1 and A2 can be crystallized as shown in FIGS. 7 and 10, or only the middle portion of the channel layer 34 located between the source and drain electrodes 46a and 46b can be crystallized as shown in FIG. 8. In this case, both ends of the upper portion 50 or 56 contact the source and drain electrodes 46a and 46b, respectively.

A first metal pattern 36a is formed between the source electrode 40a and the first portion A1. A second metal pattern 36b is formed between the drain electrode 40b and the second portion A2. The first and second metal patterns 36a and 36b may be titanium (Ti) patterns. The first and second metal patterns 36a and 36b are optional patterns. The first and second metal patterns 36a and 36b may not be shown in a final TFT product if the first and second metal patterns 36a and 36b are completely consumed to form the first and second portions A1 and A2 of the channel layer 34. The source and drain electrodes 40a and 40b are formed of platinum (Pt). Alternatively, the source and drain electrodes 40a and 40b can be formed of other kinds of metal.

A method of manufacturing a TFT including a selectively crystallized channel layer will now be described according to embodiments of the present invention.

First Embodiment

Figure 2:
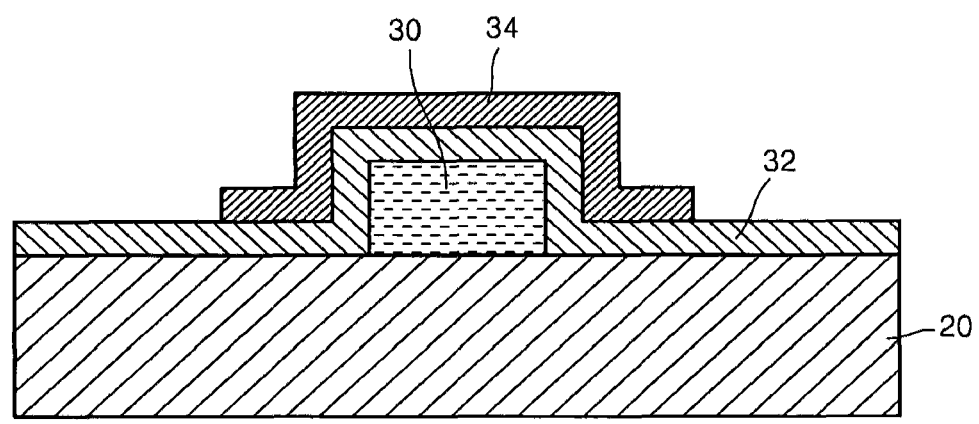
FIGS. 2 through 4 are cross-sectional views for explaining a method of manufacturing a TFT according to an embodiment of the present invention.

Referring to FIG. 2, a gate 30 is formed on a substrate 20. The substrate 20 may be an insulation substrate. For example, the substrate 20 may be a glass substrate or a semiconductor substrate including an insulation layer thereon. The gate 30 may be formed of molybdenum (Mo). Alternatively, the gate 30 can be formed of other conductive materials. A gate insulation layer 32 is formed on the substrate 20 to cover top and side surfaces of the gate 30. The gate insulation layer 32 may be formed of a silicon oxide. A channel layer 34 is formed on the gate insulation layer 32. The channel layer 34 may be formed of an amorphous oxide semiconductor. For example, the channel layer 34 may be formed of a(In2O3).b(Ga2O3).c(ZnO) (where a, b, and c are real numbers, and a≥0, b≥0, and c>0).

A metal layer (not shown) and an electrode layer (not shown) are sequentially formed on the gate insulation layer 32 to cover the channel layer 34. The metal layer may be formed of a metal which can be diffused into the channel layer 34 in a following heat treatment process such as annealing. For example, the metal layer can be formed of titanium (Ti). The metal layer may have a thickness in the range of 0.1 nm to 100 nm. Alternatively, the metal layer can be formed of a metal other than titanium (Ti). For example, the metal layer can be formed of lanthanum (La). In this case, the thickness of the metal layer may be not in the range of 0.1 nm to 100 nm. The electrode layer will form source and drain electrodes. The electrode layer may be formed of platinum (Pt). Alternatively, the electrode layer can be formed of other metals. For example, the electrode layer can be formed of at least one selected from the group consisting of Ti, Mo, Cr, W, Zr, Hf, Nb, Ta, Ag, Au, Al, Cu, Co, Sb, V, Ru, Pd, Zn, and Mg.

The electrode layer and the metal layer are sequentially etched using a mask (not shown) defining source and drain regions. The electrode layer and the metal layer are sequentially etched until the channel layer 34 and the gate insulation layer 32 are exposed. After that, the mask is removed.

Figure 3:
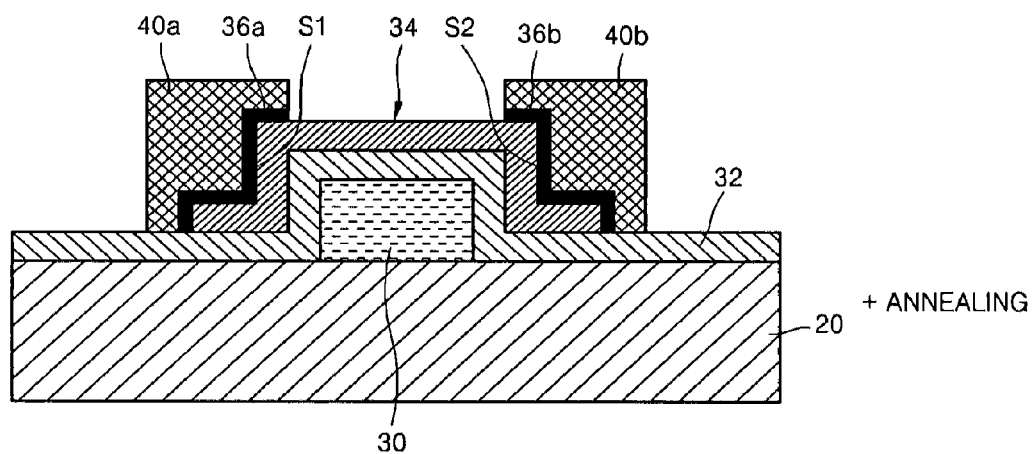

FIG. 3 is a cross-sectional view illustrating the electrode layer and the metal layer when the mask is removed after the etching.

Referring to FIG. 3, a first metal pattern 36a is formed above the gate insulation layer 32. The first metal pattern 36a may be formed on a first side S1 of the channel layer 34 and a top surface portion of the channel layer 34 adjacent to the first side S1 of the channel layer 34. A source electrode 40a is formed on the first metal pattern 36a. A second metal pattern 36b is also formed above the gate insulation layer 32. The second metal pattern 36b may be formed on a second side S2 of the channel layer 34 and a top surface portion of the channel layer 34 adjacent to the second side S2 of the channel layer 34. A drain electrode 40b is formed on the second metal pattern 36b. A top surface of the channel layer 34 is exposed between the first and second metal patterns 36a and 36b.

After the first metal pattern 36a, the second metal pattern 36b, the source electrode 40a, and the drain electrode 40b are formed, heat treatment such as annealing is performed. The heat treatment or the annealing may be performed in a nitrogen gas atmosphere for one hour using a furnace, a rapid thermal annealing (RTA) apparatus, or a laser. The annealing conditions can be changed if necessary. The annealing can be performed at a temperature of 200° C. to 450° C. to selectively crystallize the channel layer 34. Metal (e.g. titanium (Ti)) of the first and second metal patterns 36a and 36b are diffused into the channel layer 34 by the annealing.

Figure 4:
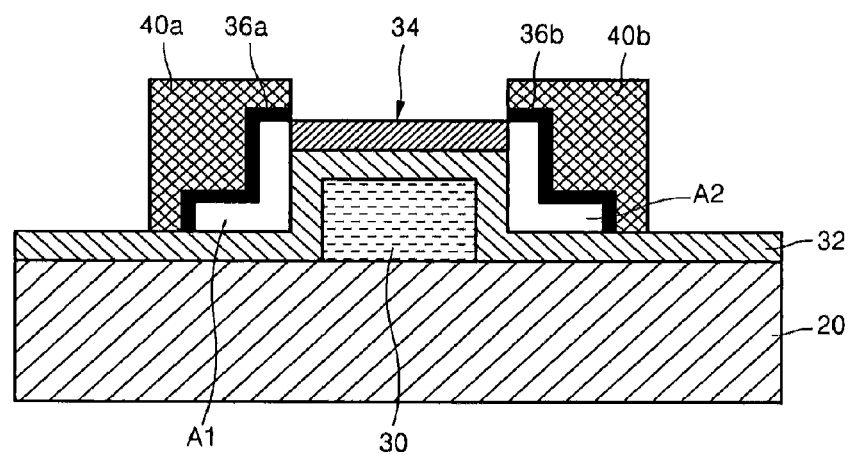

Owing to the diffusion of the first and second metal patterns 36a and 36b, first and second regions A1 and A2 of the channel layer 34, which are respectively covered with the first and second metal patterns 36a and 36b, are crystallized as shown in FIG. 4.

After the annealing, the first and second metal patterns 36a and 36b between the channel layer 34 and the source and drain electrodes 40a and 40b can be completely disappeared by adjusting the time of the annealing and the thickness of the first and second metal patterns 36a and 36b.

Second Embodiment

In the current embodiment, only the surface of the channel layer 34 is crystallized by the ion implantation.

In the following description, like reference numerals in the drawings denote like elements.

Figure 5:
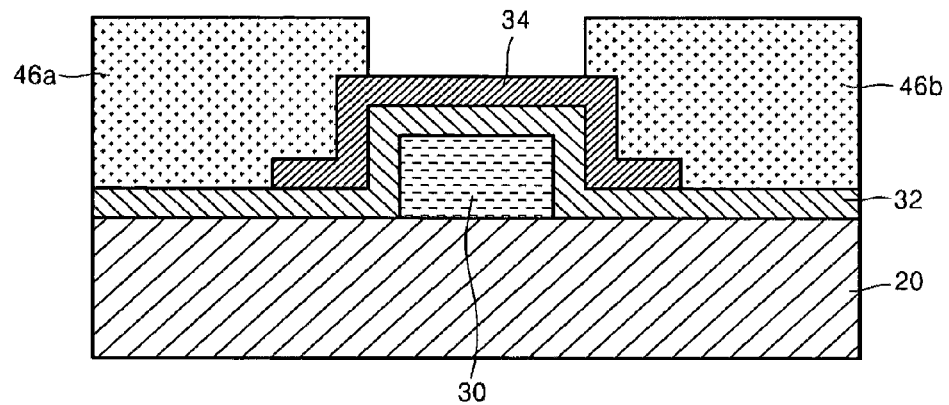
FIGS. 5 through 8 are cross-sectional views for explaining a method of manufacturing a TFT according to another embodiment of the present invention.

Referring to FIG. 5, the operation of forming the channel layer 34 on the gate insulation layer 32 and the previous operations are the same as those of the previous embodiment described with reference to FIGS. 2 through 4. Then, a source electrode 46a is formed on the gate insulation layer 32 to cover one side portion of the channel layer 34, and a drain electrode 46b is formed on the gate insulation layer 32 to cover the other side portion of the channel layer 34. The source and drain electrodes 46a and 46b may correspond in material and position to the source and drain electrodes 40a and 40b of the previous embodiment.

Figure 6:
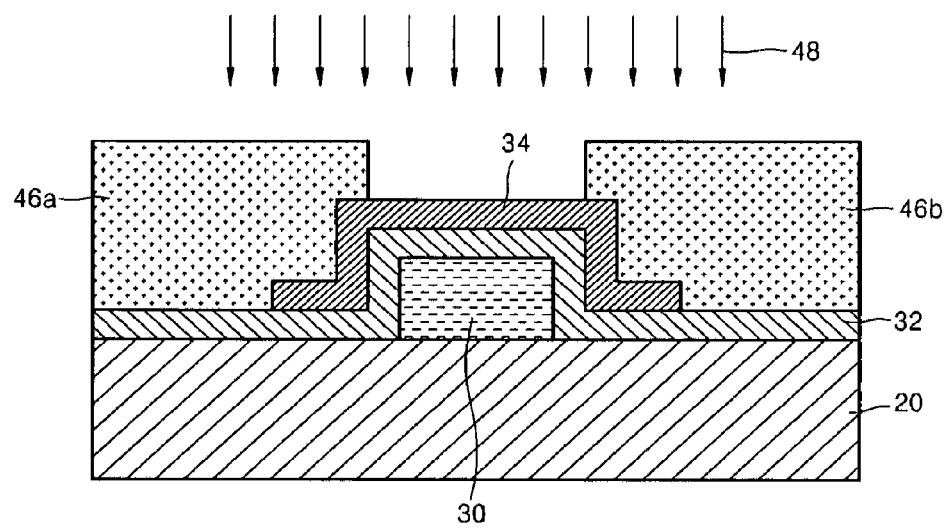

Referring to FIG. 6, a metal component 48 is implanted into the channel layer 34 through an opening between the source and drain electrodes 46a and 46b. For example, the metal component 48 may be titanium (Ti) or lanthanum (La). The metal component 48 can be implanted to a predetermined depth from the top surface of the channel layer 34 by adjusting ion implantation energy. For example, the metal component 48 can be implanted only into an outermost layer of the channel layer 34. In addition, the concentration of the metal component 48 in the channel layer 34 can be adjusted depending on the ion-implantation area of the channel layer 34. After the metal component 48 is implanted, the channel layer 34 can be heat-treated to evenly distribute and diffuse the metal component 48 in the channel layer 34.

FIG. 7 shows the channel layer 34 after the ion implantation.

Referring to FIG. 7, an upper portion 50 of the channel layer 34 between the source and drain electrodes 46a and 46b is crystallized.

Alternatively, as shown in FIG. 8, a middle portion 52 of the channel layer 34 located between the source and drain electrodes 46a and 46b can be entirely crystallized by increasing ion implantation energy when the metal component 48 is implanted into the channel layer 34 and performing heat treatment after the ion implantation.

Third Embodiment

In the current embodiment, the surface of the channel layer 34 is crystallized without using ion implantation.

Figure 9:
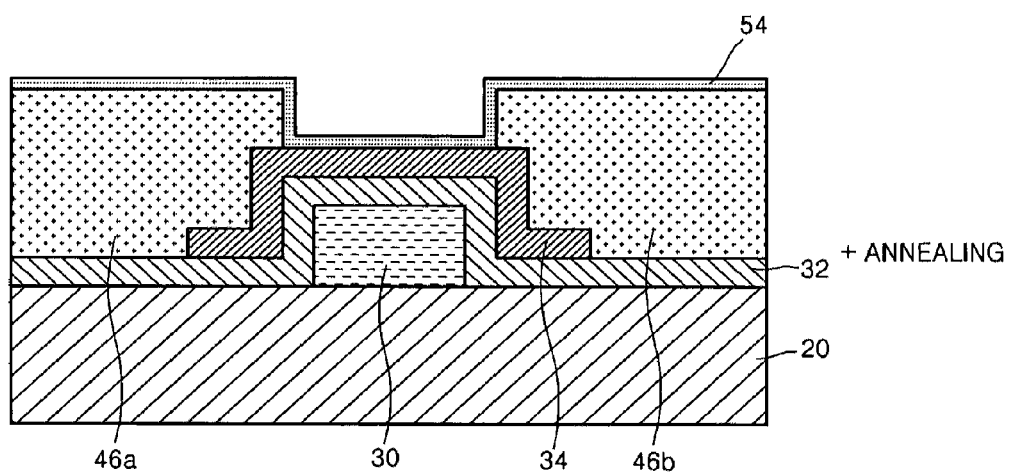
FIGS. 9 and 10 are cross-sectional views for explaining a method of manufacturing a TFT according to still another embodiment of the present invention.

Referring to FIG. 9, the operation of forming the source and drain electrodes 46a and 46b and the previous operations are the same as those of the previous embodiment described with reference to FIG. 5. Then, a metal layer 54 is formed above the gate insulation layer 32 to cover the source and drain electrodes 46a and 46b and the top surface of the channel layer 34 exposed between the source and drain electrodes 46a and 46b. For example, the metal layer 54 may be formed of titanium (Ti).

Thereafter, the metal layer 54 and the channel layer 34 are annealed. The annealing of the metal layer 54 and the channel layer 34 may be performed in the same manner as that performed in the previous embodiment. During the annealing, a metal component of the metal layer 54 is diffused into the channel layer 34. Then, if the metal layer 54 remains after the annealing, the remaining metal layer 54 is removed. As a result, as shown in FIG. 10, a surface portion 56 of the channel layer 34 connected between the source and drain electrodes 46a and 46b is crystallized.

The above-described embodiments discuss methods of manufacturing a bottom gate type TFT in which a gate is formed under a channel layer. However, the present invention is not limited thereto. For example, the present invention can be applied to a top gate type TFT in which a gate is formed above a channel layer.

In the above-described embodiments, the metal component is injected into the channel layer 34 to selectively crystallize the channel layer 34 using one of first and second processes. In the first process, a metal layer is formed on the channel layer 34, and then the metal layer is heat-treated to diffuse a metal component of the metal layer into the channel layer 34. In the second process, a metal component is injected into the channel layer 34 by ion implantation.

Alternatively, the metal component can be injected into the channel layer 34 using both the first and second processes. For example, a metal component can be diffused into side portions of the channel layer 34 adjacent to the source and drain electrodes using the first process, and a metal component can be injected into a portion of the channel layer 34 located between the source and drain electrodes using the second process. The first process can be performed before or after the second process is performed.

Figure 11:
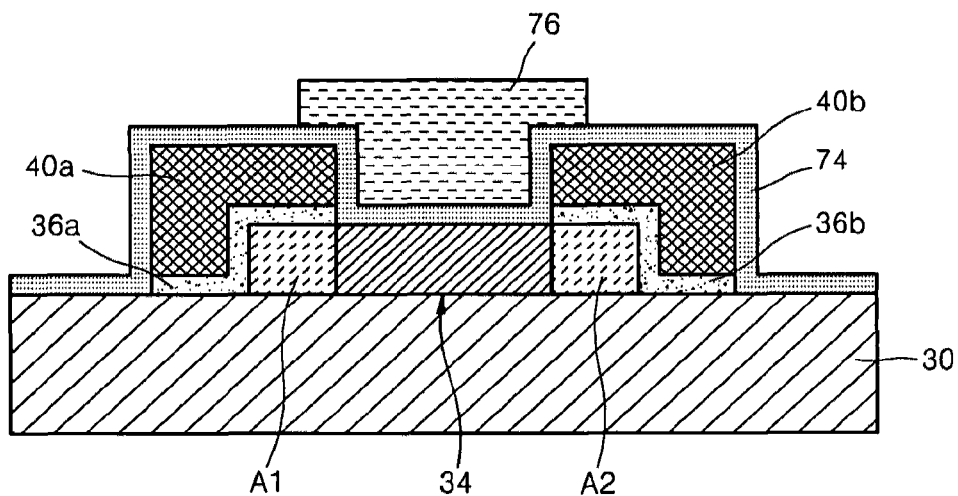
FIG. 11 is a cross-sectional view illustrating a TFT having a top gate structure according to an embodiment of the present invention.

FIG. 11 is a cross-sectional view illustrating a TFT having a top gate structure according to an embodiment of the present invention.

Referring to FIG. 11, a channel layer 34 is formed on a substrate 70. The substrate 70 may be the same as the substrate 20 illustrated in FIG. 1. A first metal pattern 36a is formed on the substrate 70 to cover a first portion A1 of the channel layer 34, and a source electrode 40a is formed on the first metal pattern 36a. A second metal pattern 36b is formed on the substrate 70 to cover a second portion A2 of the channel layer 34, and a drain electrode 40b is formed on the second metal pattern 36b. A gate insulation layer 74 is formed on the substrate 70 to cover the source electrode 40a, the drain electrode 40b, and a top surface portion of the channel layer 34. The gate insulation layer 74 may be same as the gate insulation layer 32 illustrated in FIG. 1. A gate electrode 76 is formed on the gate insulation layer 74. The gate electrode 76 is formed on the gate insulation layer 74 above the channel layer 34. The gate electrode 76 may be formed of the same material as the gate 30 of FIG. 1.

Figure 12:
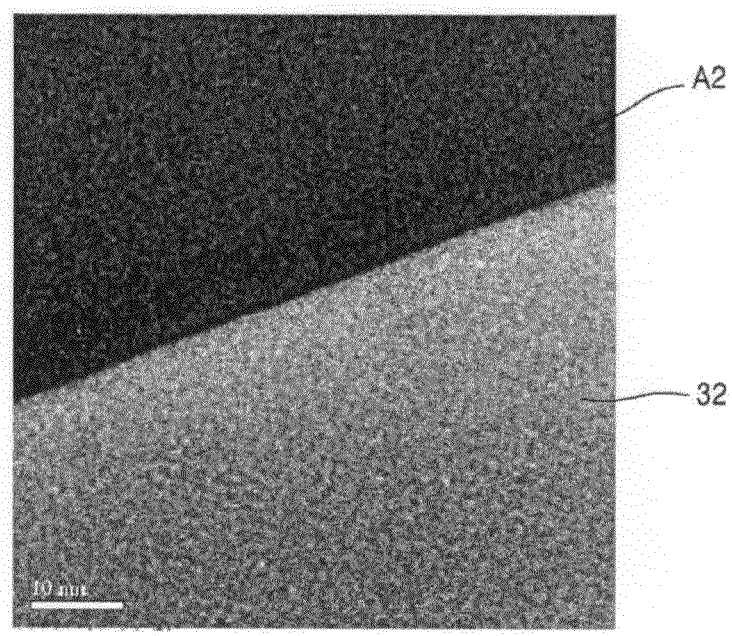
FIGS. 12 through 14 are transmission electron microscope (TEM) images illustrating partial crystallization of a channel layer of a TFT according to an embodiment of the present invention.
Figure 13:
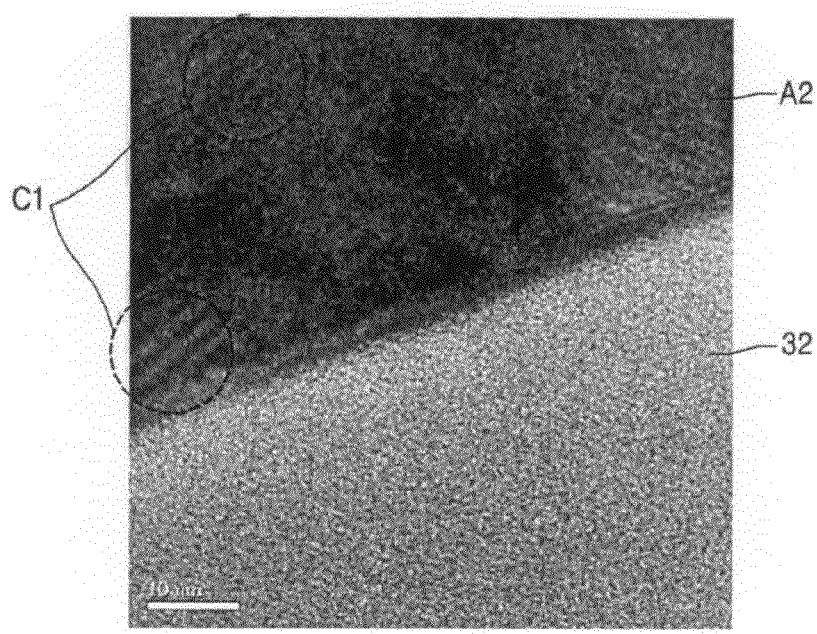

FIGS. 12 and 13 are transmission electron microscope (TEM) images of a region P1 of FIG. 1 to show states of the second portion A2 of the channel layer 34 and the gate insulation layer 32 of the TFT of FIG. 1 before and after annealing. In FIGS. 12 and 13, the channel layer 34 is formed of GIZO221. The TEM image of FIG. 12 is taken before the channel layer 34 and the gate insulation layer 32 are annealed, and the TEM image of FIG. 13 is taken after the channel layer 34 and the gate insulation layer 32 are annealed.

Referring to FIG. 12, crystals are not present in the second portion A2 of the channel layer 34 of the TFT of FIG. 1. This means that the second portion A2 of the channel layer 34 is amorphous before annealing.

Referring to FIG. 13, a periodic pattern C1 is present in the second portion A2 of the channel layer 34 of the TFT of FIG. 1. This means that the second portion A2 of the channel layer 34 is crystallized after annealing.

Meanwhile, when the channel layer 34 of the TFT of FIG. 1 is formed of GIZO221, a TEM image was taken from a second region P2 of FIG. 1 to show a state of a middle portion of the channel layer 34 located between the first and second portions A1 and A2 after the channel layer 34 and the gate insulation layer 32 are annealed. The TEM image taken from the region P2 after annealing is the same as the TEM image of FIG. 12.

This means that the middle portion of the channel layer 34 that is not in contact with the first and second metal patterns 36a and 36b is amorphous even after the annealing.

Figure 14:
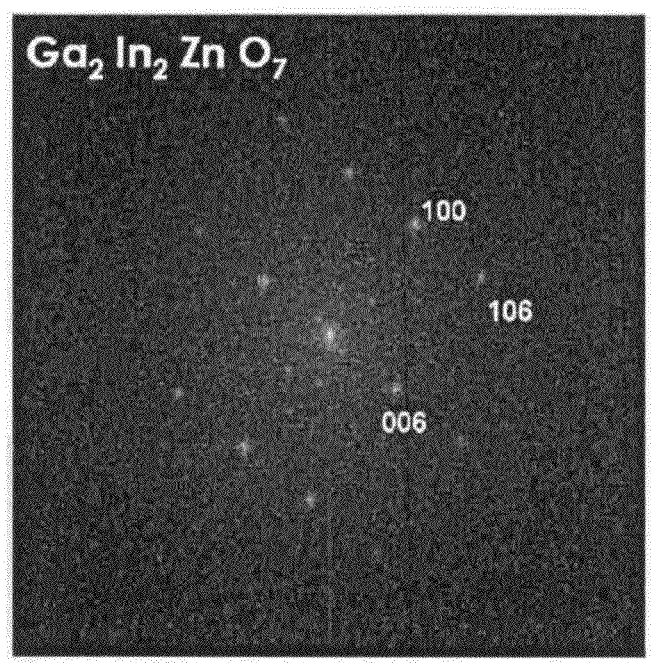

FIG. 14 illustrates TEM analysis results of a crystal structure of the second portion A2 of the channel layer 34 of FIG. 13. Referring to FIG. 14, the crystal structure of the second portion A2 of the channel layer 34 is illustrated in more detail. In FIG. 14, reference numerals 100, 106, and 006 denote crystal faces or directions.

It can be clearly understood from FIG. 14 that the second portion A2 of the channel layer 34 of FIG. 1 is a crystalline phase.

The current-voltage characteristics of a TFT of the present invention will now be described.

For this, a TFT sample was prepared according to the present invention.

Figure 15:
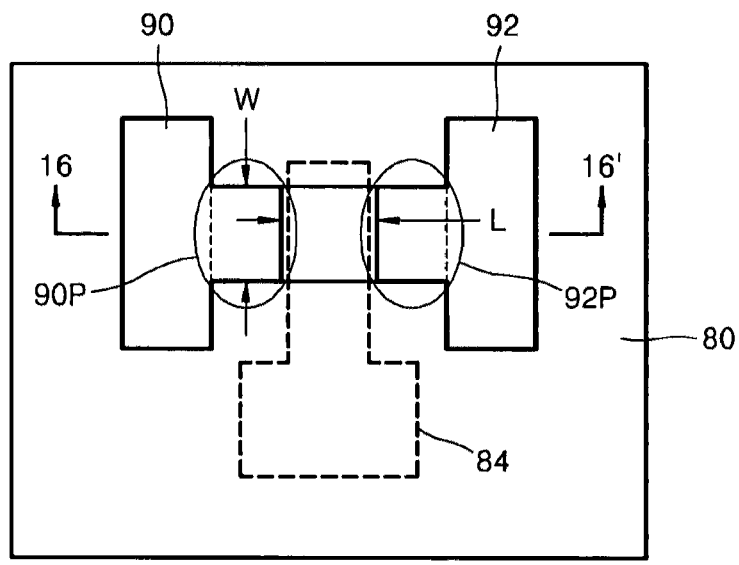
FIG. 15 is a plan view illustrating a TFT sample prepared for measuring the electric characteristics of a TFT of the present invention.
Figure 16:
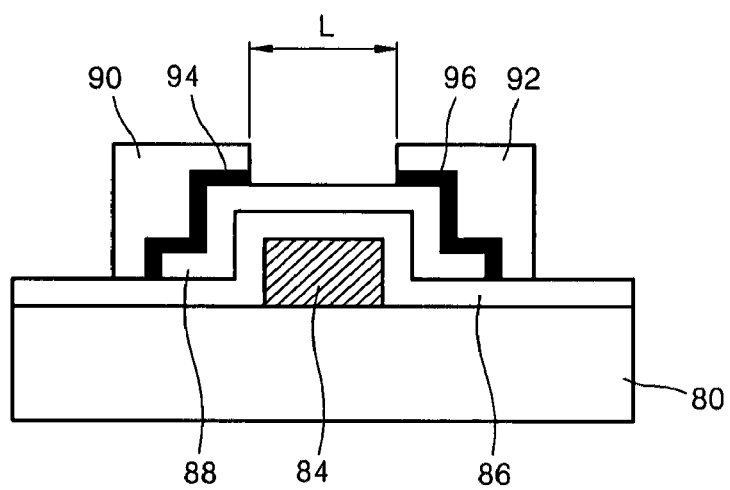
FIG. 16 is a sectional view taken along line 16-16' of FIG. 15.

FIG. 15 is a plan view illustrating the TFT sample, and FIG. 16 is a sectional view taken along line 16-16' of FIG. 15.

In FIGS. 15 and 16, reference numeral 80 denotes a substrate. The substrate 80 may be the same as the substrate 20 of FIG. 1. Reference numerals 84, 88, 90, and 92 denote a gate, a channel layer, a source, and a drain, respectively. The source 90 and the drain 92 can be interchangeable. The source and drain 90 and 92 include protrusions 90P and 92P, respectively. The protrusions 90P and 92P face each other and have a predetermined width (W). The protrusions 90P and 92P are spaced apart from each other by a length (L). The length (L) is the same as an effective length of the channel layer 88. In the TFT sample, a ratio W/L is 50/20. The source and drain 90 and 92 was formed of a low-resistance metal. For example, the source and drain 90 and 92 can be formed of at least one selected from the group consisting of Ti, Mo, Cr, W, Pt, Zr, Hf, Nb, Ta, Ag, Au, Al, Cu, Co, Sb, V, Ru, Pt, Pd, Zn, and Mg. That is, the source and drain 90 and 92 may be formed of a pure metal or an alloy. The source and drain 90 and 92 can be formed of other conductive metals having a low resistance.

Referring to FIG. 16, the gate 84 was formed in a given region on the substrate 80. A gate insulation layer 86 was formed on the substrate 80 to cover the gate 84. The gate insulation layer 86 may be a silicon oxide layer. The channel layer 88 was formed on the gate insulation layer 86. The channel layer 88 was formed on the gate insulation layer 86 over the gate 84. The channel layer 88 may be formed of an amorphous oxide semiconductor. For example, the channel layer 88 may be formed of G-I-Z-O [a(In2O3).b(Ga2O3).c(ZnO)], where a, b, and c are real numbers, and a≥0, b≥0, and c>0. In the TFT sample, the channel layer 88 was formed of GIZO221. A first metal pattern 94 and a second metal pattern 96 were formed on the channel layer 88 at positions apart from each other. The first and second metal patterns 94 and 96 were formed of titanium (Ti). The first metal pattern 94 was interposed between the source 90 and the channel layer 88 in contact with the source 90 and channel layer 88. The second metal pattern 96 was interposed between the drain 92 and the channel layer 88 in contact with the drain 92 and the channel layer 88. The first metal pattern 94 was formed from one side of the channel layer 88 to a top surface of the channel layer 88. The second metal pattern 96 was formed from the other side of the channel layer 88 to the top surface of the channel layer 88. The source 90 was formed in contact with top and side surfaces of the first metal pattern 94, and the drain 92 was formed in contact with top and side surfaces of the second metal pattern 96. The first metal pattern 94 and the second metal pattern 96 have a thickness in the range of 5 to 20 nm, and the source 90 and the drain 92 have a thickness in the range of 50 to 60 nm.

The TFT sample formed in this way was heat-treated in a nitrogen gas atmosphere for one hour at room temperature and a temperature of 200° C. to 450° C. (e.g., 350° C.). Then, the electric characteristics of the TFT sample were measured.

Figure 17:
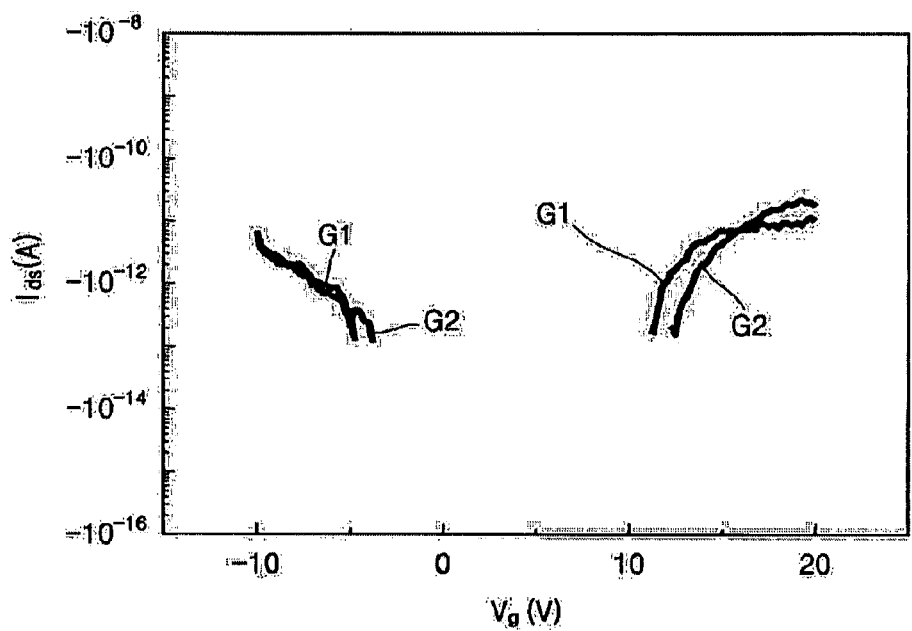
FIGS. 17 through 21 are graphs illustrating the electric characteristics measured from the TFT sample of FIG. 15.
Figure 18:
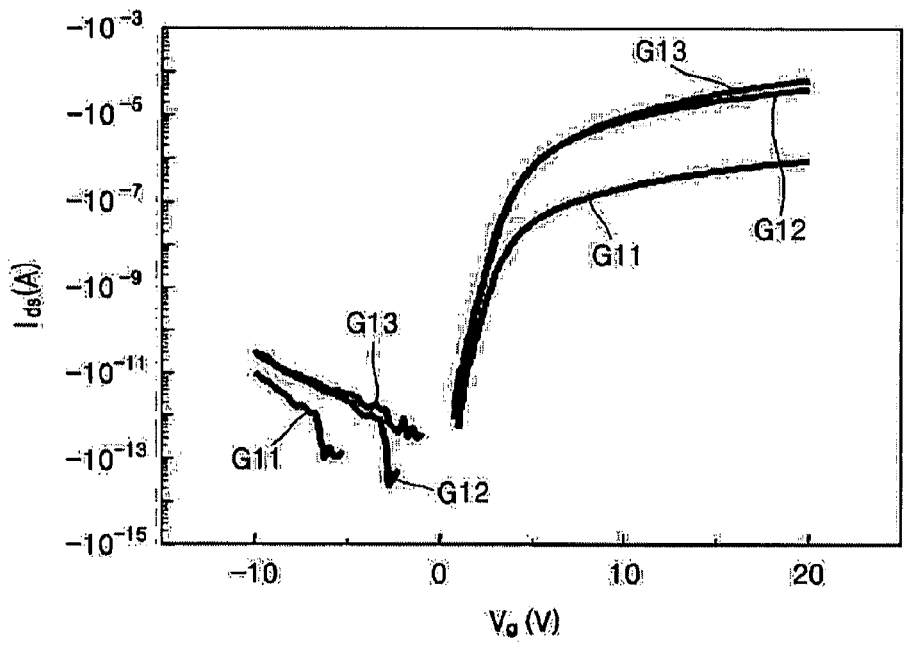

FIGS. 17 and 18 show the measured electric characteristics of the TFT sample.

FIG. 17 shows the electric characteristics of the TFT sample when the TFT sample was heat-treated at room temperature. In other words, FIG. 17 shows the electric characteristics of the TFT sample when an additional heat treatment process was not performed on the TFT sample. FIG. 18 shows the electric characteristics of the TFT sample when the TFT sample was heat-treated at 350° C.

Referring to FIG. 17, a source-drain current $I_{ds}$ is not detected until a gate voltage $V_g$ increases above 10 V. Although the source-drain current $I_{ds}$ is detected after the gate voltage $V_g$ increases above 10 V, the detected source-drain current $I_{ds}$ is negligible since the source-drain current $I_{ds}$ is very small (around $10^{-12}$ A). In FIG. 17, curves G1 and G2 denote source-drain currents $I_{ds}$ when a drain voltage is 5 V and 10 V, respectively.

It can be understood that the channel layer 88 of the TFT sample is almost non-conductive when the TFT sample is not heat-treated.

On the other hand, referring to FIG. 18, it can be understood that the TFT sample operates normally in enhanced mode when the TFT sample is heat-treated at a temperature of 350° C. In FIG. 18, curves G11, G12, and G13 denote source-drain currents $I_{ds}$ when a drain voltage is 0.1 V, 5 V, and 10 V, respectively.

As shown in FIG. 18, the TFT sample exhibits electrical characteristics of a normal TFT when the TFT sample is heat-treated. The reason for this can be explained as follows.

First, since the channel layer 88 formed of GIZO221 has a high oxygen concentration before the TFT sample is heat-treated, the channel layer 88 has a high resistance. Therefore, the channel layer 88 is non-conductive. However, after the TFT sample is heat-treated, the oxygen concentration of the channel layer 88 decreases, and thus the resistance of the channel layer 88 decreases.

Secondly, titanium (Ti) thin layers (the first and second metal patterns 94 and 96), which are formed between the channel layer 88 and the source and drain 90 and 92, are diffused into the channel layer 88 by heat treatment. Therefore, portions of the channel layer 88 facing the source and drain 90 and 92 are crystallized.

In this way, the source 90 and the drain 92 contact the crystallized portions of the channel layer 88 after the TFT sample is heat-treated. Therefore, the source 90 and the drain 92 can contact the channel layer 88 more stably as compared with the case where the channel layer is not crystallized (i.e., the channel layer is amorphous).

In addition, the following experiment was performed to find out whether the two reasons are due to a change of the channel layer 88 itself by heat treatment or crystallization of the channel layer 88 caused by diffusion of titanium into the channel layer 88 by the heat treatment.

For this experiment, first to third TFT samples having a width/Length ratio of 50/4 were prepared. The first to third TFT samples were heat-treated at 350° C. for one hour in a $N_2$ gas atmosphere. The heat treatment was performed after channel layers 88 of the first to third TFT samples were formed but before first and second metal patterns 94 and 96 were formed (hereinafter, referred to as a first time point), or after sources 90 and drains 92 of the first to third TFT samples were formed (hereinafter, referred to as a second time point).

In detail, the experiment was performed by first through third methods depending on the time and number of the heat treatment as follows.

In the first method, the first TFT sample was heat-treated only at the first time point.

In the second method, the second TFT sample was heat-treated only at the second time point.

In the third method, the third TFT sample was heat-treated both at the first and second time points.

Figure 19:
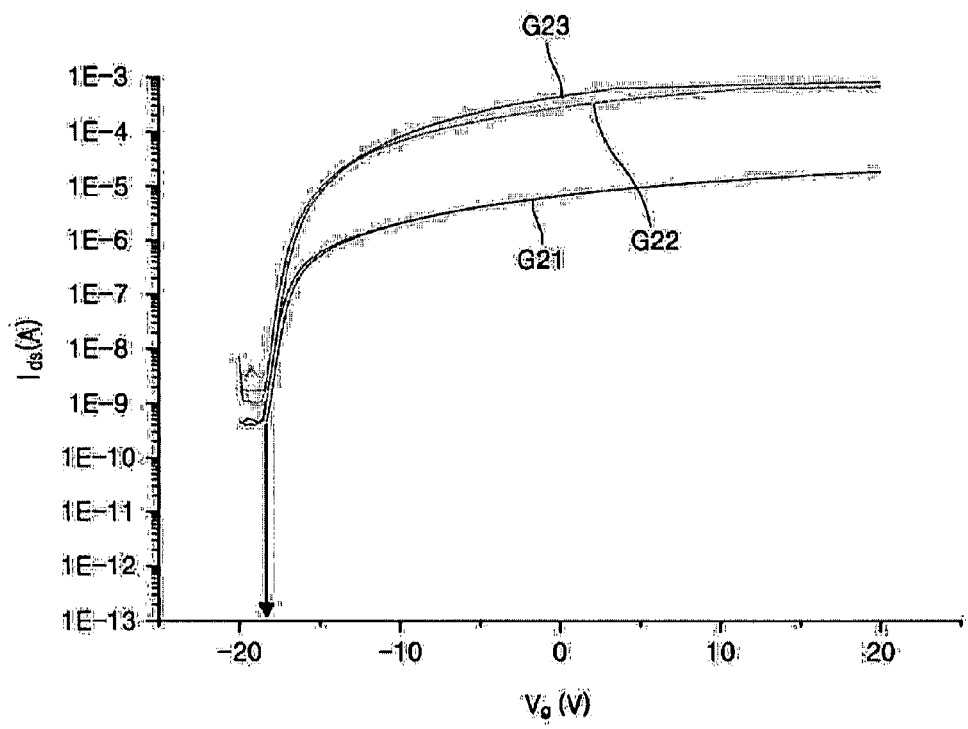
Figure 20:
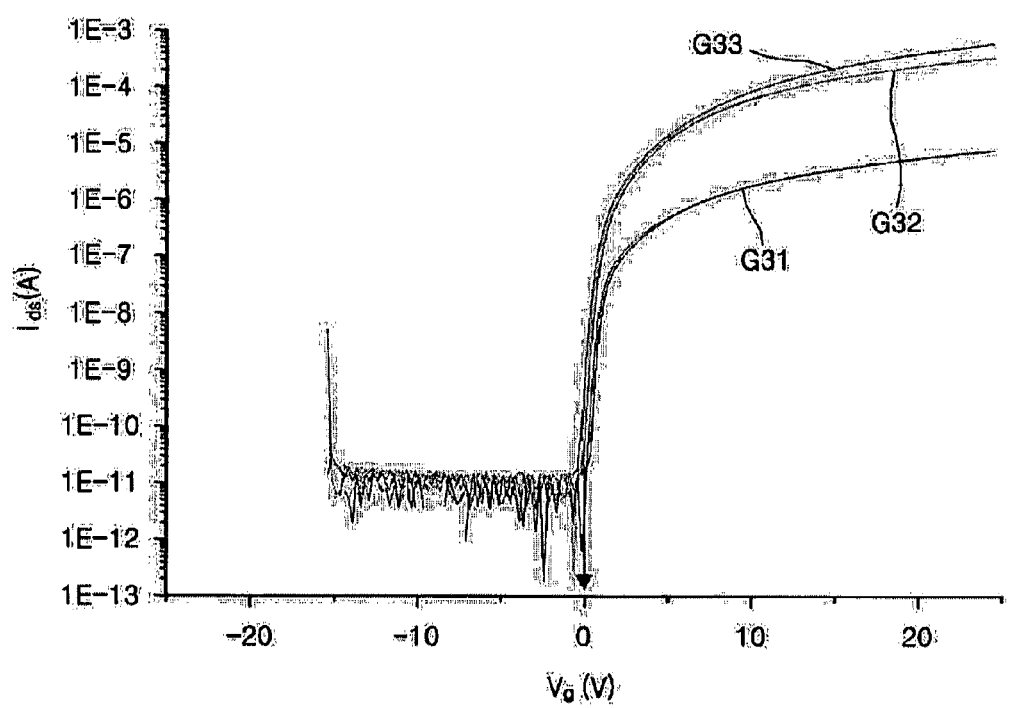
Figure 21:
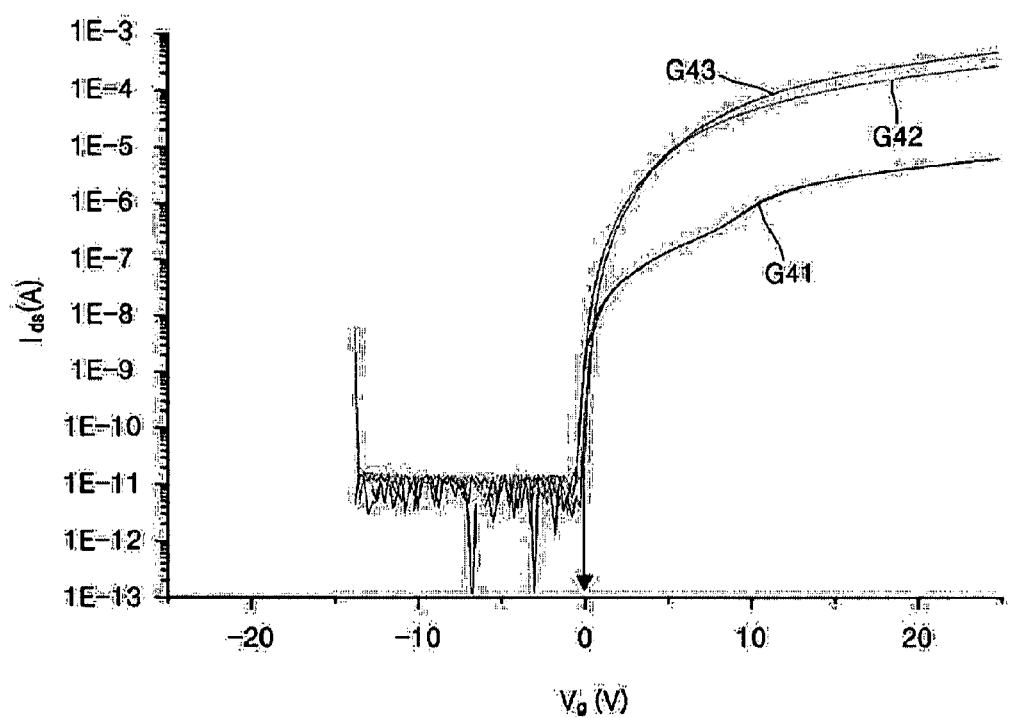

FIGS. 19 through 21 show current-voltage characteristics of the first to third TFT samples that were heat-treated by the first through third methods, respectively.

In FIGS. 19 through 21, first curves G21, G31, and G41 denote the current-voltage characteristics of the first to third TFT samples when a drain voltage is 0.1 V; second curves G22, G32, and G42 denote the current-voltage characteristics of the first to third TFT samples when the drain voltage is 0.5 V; and third curves G23, G33, and G43 denote the current-voltage characteristics of the first to third TFT samples when the drain voltage is 1.0 V.

Since the channel layers 88 of the first and second TFT samples were heat-treated under the same conditions in the first and second method, the channel layers 88 of the first and second TFT samples may exhibit the same characteristics.

However, when FIG. 19 showing results by the first method is compared with FIG. 20 showing results by the second method, the characteristics of the channel layers 88 of the first and second TFT sample are not the same.

In detail, although an off-current can be assumed to be zero in FIG. 20, an off-current of FIG. 19 is much larger than that of FIG. 20.

Although the channel layers 88 of the first and second TFT samples were heat-treated under the same conditions in the first and second methods, the off-currents of the first and second TFT samples are different. The reason for this can be explained as follows.

In the second method, the first metal pattern 94, the second metal pattern 96, the source 90, and the drain 92 of the second TFT sample were heat-treated. However, in the first method, the first metal pattern 94, the second metal pattern 96, the source 90, and the drain 92 of the first TFT sample were not heat-treated The off-current can be assumed to be zero in FIG. 20 because in the second method, a metal component (i.e., titanium (Ti)) of the first and second metal patterns 94 and 96 was diffused into the channel layer 88 to crystallize portions of the channel layer 88 contacting the source 90 and the drain 92. Therefore, the channel layer 88 can contact the source 90 and the drain 92 more stably, and thus the off-current can be approximately zero.

It can be understood from the experimental results shown in FIGS. 19 and 20 that the heat treatment performed at the first time point does reduce the off-current of the TFT sample. However, the heat treatment performed at the second time point reduces the off-current of the TFT sample.

This can be confirmed from the fact that the experimental results of the third method shown in FIG. 21 are approximately the same as the experimental results of the second method shown in FIG. 20.

While the present invention has been particularly shown and described with reference to exemplary embodiments thereof, it will be understood by those of ordinary skill in the art that various changes in form and details may be made therein without departing from the spirit and scope of the present invention. For example, the structure or any element of the TFT having a bottom gate structure or a top gate structure can be changed without departing from the spirit and scope of the present invention. Therefore, the scope and spirit of the present invention should be defined by the following claims.

As described above, in the TFT of the present invention, the surface portions of the channel layer contacting the source and the drain and/or the other surface portion of the channel layer are crystallized, and remaining portion of the channel layer remains amorphous. Alternatively, the entire channel layer can be crystallized.

As a result, stable contact between the channel layer, and the source and the drain can be realized, and thus the off-current of the TFT can be reduced. Furthermore, only the surface of the channel layer can be crystallized to a thin thickness, and the other portion of the channel layer can remain amorphous, such that the charge carrier mobility of the TFT can be increased, and deterioration of the characteristics of the TFT caused by grain boundaries of the crystallized channel layer can be minimized.

Moreover, since the channel layer is crystallized using a metal such as titanium (Ti), the channel layer can be selectively crystallized at a temperature lower than the crystallization temperature of the channel layer.

What is claimed is:

1. A thin film transistor (TFT) comprising:
   a gate, a channel layer, a source, and a drain, wherein
   the channel layer is formed of an oxide semiconductor,
   an exposed portion of the channel layer between the source and drain is amorphous, and
   only a portion of the channel layer contacting the source and the drain is a crystallized portion, the portion of the channel layer includes, only a first portion of the channel layer formed entirely under the source and only a second portion of the channel layer formed entirely under the drain.

2. The TFT of claim 1, further comprising:
a metal layer formed on the channel layer under the source and the drain.

3. The TFT of claim 1, wherein the source and the drain are formed of at least one selected from the group consisting of Ti, Mo, Cr, W, Zr, Hf, Nb, Ta, Ag, Au, Al, Cu, Co, Sb, V, Ru, Pt, Pd, Zn, and Mg.

4. The TFT of claim 1, wherein the oxide semiconductor is $a(In_2O_3).b(Ga_2O_3).c(ZnO)$ doped with a metal, where a, b, and c are real numbers, and $a \geq 0$, $b \geq 0$, and $c > 0$.

5. The TFT of claim 4, wherein the metal is lanthanum (La) or titanium (Ti).

6. A method of manufacturing a thin film transistor (TFT) including a gate, a channel layer, a source, and a drain, wherein the channel layer is formed of an oxide semiconductor, an exposed portion of the channel layer between the source and drain is amorphous, and only a portion of the channel layer contacting the source and the drain is a crystallized portion, and wherein the portion of the channel layer includes only a first portion of the channel layer formed entirely under the source and only a second portion of the channel layer formed entirely under the drain, wherein the method comprises:
forming the channel layer using the oxide semiconductor; and
crystallizing the portion of the channel layer contacting the source and the drain by injecting a metal component into the channel layer.

7. The method of claim 6, wherein the injecting of the metal component comprises:
forming a metal layer on the channel layer; and
heat-treating a resulting structure including the metal layer.

8. The method of claim 7, wherein the metal layer is formed to a first thickness such that the metal layer disappears after the heat-treating.

9. The method of claim 7, wherein the metal layer is formed on the channel layer under the source and the drain.

10. The method of claim 7, wherein the forming of the metal layer comprises:
forming the source and the drain on the channel layer; and
forming the metal layer on the source, the drain, and a top surface portion of the channel layer located between the source and the drain.

11. The method of claim 7, wherein the metal layer is formed on side surfaces and a top surface of the channel layer.

12. The method of claim 11, wherein the heat-treating is performed after forming the source and the drain on the metal layer.

13. The method of claim 7, wherein the heat-treating is performed in a nitrogen gas atmosphere in a temperature range of about 200° C. to about 450° C. using a furnace, a rapid thermal annealing (RTA) apparatus, or a laser.

14. The method of claim 6, wherein the injecting of the metal component comprises:
ion-injecting the metal component into the channel layer; and
heat-treating the channel layer.

15. The method of claim 14, wherein the metal component is ion-injected into the portion of the channel layer.

16. The method of claim 15, wherein the metal component is ion-injected into the channel layer before the source and drain are formed.

17. The method of claim 14, wherein the ion-injecting of the metal component is performed after forming the source and the drain.

18. The method of claim 6, wherein the metal component is titanium (Ti) or lanthanum (La).

19. The method of claim 6, wherein the oxide semiconductor is $a(In_2O_3).b(Ga_2O_3).c(ZnO)$, where a, b, and c are real numbers, and $a \geq 0$, $b \geq 0$, and $c > 0$.

* * * * *